(12) United States Patent
Garcia (10) Patent No.: US 8,970,238 B2
(45) Date of Patent: Mar. 3, 2015

(54) PROBE MODULE WITH INTERLEAVED SERPENTINE TEST CONTACTS FOR ELECTRONIC DEVICE TESTING

(75) Inventor: Douglas J. Garcia, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 929 days.

(21) Appl. No.: 13/163,516

(22) Filed: Jun. 17, 2011

(65) Prior Publication Data

US 2012/0319712 A1 Dec. 20, 2012

(51) Int. Cl.
  *G01R 31/20* (2006.01)
  *G01R 1/067* (2006.01)
  *G01R 3/00* (2006.01)
  *G01R 31/28* (2006.01)

(52) U.S. Cl.
  CPC .............. *G01R 1/06716* (2013.01); *G01R 3/00* (2013.01); *G01R 1/06733* (2013.01); *G01R 31/2889* (2013.01)
  USPC ...... 324/754.01; 324/437; 324/500; 324/537; 324/754.03; 324/754.04; 324/754.05; 324/754.06; 324/754.07; 324/754.08; 324/754.1; 324/754.11; 324/755.01; 324/755.11; 324/715

(58) Field of Classification Search
  CPC .......... G01R 1/06733; G01R 1/06716; G01R 1/06722; G01R 1/06788; G01R 31/2889; G01R 3/00
  USPC ............................. 324/500, 537, 754.01, 437, 324/754.03–754.08, 754.1, 754.11, 755.01, 324/755.11, 715
  See application file for complete search history.

(56) References Cited

U.S. PATENT DOCUMENTS

| | | | | |
|---|---|---|---|---|
| 3,911,361 | A * | 10/1975 | Bove et al. | 324/754.07 |
| 5,936,243 | A * | 8/1999 | Gibson et al. | 850/26 |
| 6,573,699 | B1 * | 6/2003 | Hama et al. | 324/96 |
| 6,674,297 | B1 * | 1/2004 | Florence et al. | 324/754.13 |
| 7,474,110 | B2 * | 1/2009 | Mochizuki et al. | 324/756.03 |
| 8,159,256 | B2 * | 4/2012 | Hoshino et al. | 324/762.01 |
| 8,324,919 | B2 * | 12/2012 | Chabineau-Lovgren et al. | 324/755.11 |
| 2004/0100295 | A1 * | 5/2004 | Lee | 324/761 |
| 2007/0259506 | A1 * | 11/2007 | Hoshino et al. | 438/400 |

(Continued)

FOREIGN PATENT DOCUMENTS

| | | |
|---|---|---|
| JP | 2010-048729 | 3/2010 |
| KR | 10-2007-010278 | 10/2007 |
| KR | 10-2011-0022673 | 3/2011 |

OTHER PUBLICATIONS

Korean Intellectual Property Office, International Search Report and Written Opinion in corresponding International application No. PCT/US2012/040058, dated Dec. 2, 2012.

*Primary Examiner* — Patrick Assouad
*Assistant Examiner* — Sean Curtis
(74) *Attorney, Agent, or Firm* — Young Basile Hanlon & MacFarlane P.C.

(57) ABSTRACT

A probe module for testing an electronic device comprises at least two contacts, each contact including a first end portion extending in a first direction along a first line, a second end portion extending linearly in a second direction opposite from the first direction and along a second line, and a third curved portion extending between the first end portion and the second end portion. The first line is spaced apart from and in parallel with the second line, and the at least two contacts are spaced apart from each other in a direction perpendicular to the first line and the second line. Methods for making such a probe module are also taught.

18 Claims, 5 Drawing Sheets

(56) References Cited

U.S. PATENT DOCUMENTS

| | | | |
|---|---|---|---|
| 2007/0290699 A1* | 12/2007 | Mochizuki et al. | 324/754 |
| 2008/0094090 A1* | 4/2008 | Kimoto | 324/762 |
| 2010/0077597 A1* | 4/2010 | Hoshino et al. | 29/592.1 |
| 2010/0244875 A1* | 9/2010 | Chabineau-Lovgren et al. | 324/757 |

* cited by examiner

PROBE MODULE WITH INTERLEAVED SERPENTINE TEST CONTACTS FOR ELECTRONIC DEVICE TESTING

FIELD OF THE INVENTION

The disclosure relates to the field of electronic device testing and, more particularly, to probes for testing miniature electronic devices.

BACKGROUND

Many electronic devices are tested for electrical and optical properties during manufacturing by automated test systems. Typical automatic test systems use precision electrical or optical test equipment to find values associated with electrical and optical properties of a device and either accept, reject or sort it into an output category depending upon the measured values. For miniature devices, automatic test systems are often designed to handle bulk loads, where the manufacturing process creates a volume of devices that have substantially identical mechanical characteristics such as size and shape but differ in electrical or optical characteristics. It is common practice to build a volume of devices with electrical and optical properties that generally fall within a range and rely on testing to sort the devices into commercially useful groups with similar characteristics.

These devices are often supplied to the test equipment as containers filled with devices. Typically the test equipment must extract a single device from the bulk load of devices, orient the device and fixture it so the test equipment can perform the desired tests. Testing often requires probing the device, wherein electrical leads are brought into contact with device to permit signals and power to be applied to the device and to monitor responses to the inputs. Other tests involve measuring light output from optical devices such as light emitting diodes (LEDs) in response to specific inputs. The task of the automatic test system is to determine the electrical or optical characteristics of devices and sort the devices into groups depending upon those characteristics.

BRIEF SUMMARY

Embodiments of probe modules for testing generally miniature electronic devices are taught herein. These probes desirably include interleaved serpentine electrical contacts that allow a close contacting pitch, uniform contact force through a range of travel, and a generally linear motion of travel.

According to one embodiment of a probe module taught herein, there exist as least two contacts. Each contact includes a first end portion extending in a first direction along a first line, a second end portion extending linearly in a second direction opposite from the first direction and along a second line, and a third curved portion extending between the first end portion and the second end portion. The first line is spaced apart from and in parallel with the second line, and the at least two contacts are spaced apart from each other in a direction perpendicular to the first line and the second line.

Methods of manufacturing a probe module are also taught herein. According to one exemplary method, at least two contacts are arranged in a spaced relationship with each other. Each contact includes a first end portion extending in a first direction along a first line, a second end portion extending linearly in a second direction opposite from the first direction and along a second line, and a third curved portion extending between the first end portion and the second end portion. The contacts are arranged such that they are spaced apart from each other in a direction perpendicular to the first line and the second line. The first line is spaced apart from and in parallel with the second line.

Details of and variations in these embodiments and others are described hereinafter.

BRIEF DESCRIPTION OF THE DRAWINGS

The description herein makes reference to the accompanying drawings wherein like reference numerals refer to like parts throughout the several views, and wherein.

DETAILED DESCRIPTION

While automated test systems for electronic components or devices are known, existing systems are not generally useful with respect to LEDs. Testing and sorting LEDs is particularly challenging because the wide variance in manufacturing tolerances and the sensitivity of the human eye to small variations in light output combine to require that LEDs be tested and sorted into a large number of output groups. Another challenge associated with testing and sorting LEDs includes the fact that LEDs need to have their light output tested. Since LEDs can have contacts on one side of the package and light emitting surfaces on another, the test equipment must probe from one side and collect light output from the other. Because contacts on miniature electronic components, like LEDs, tend to be spaced close together, this creates problems with space for connections to the probes intended to test these contacts. This is particular true for LEDs since there is little standardization in the arrangement of contacts, and often multiple active elements are housed together. Another challenge is that light output test equipment is often physically large and needs to be in proximity to the LED under test, which further constrains the physical layout of the test equipment.

Figure 1:
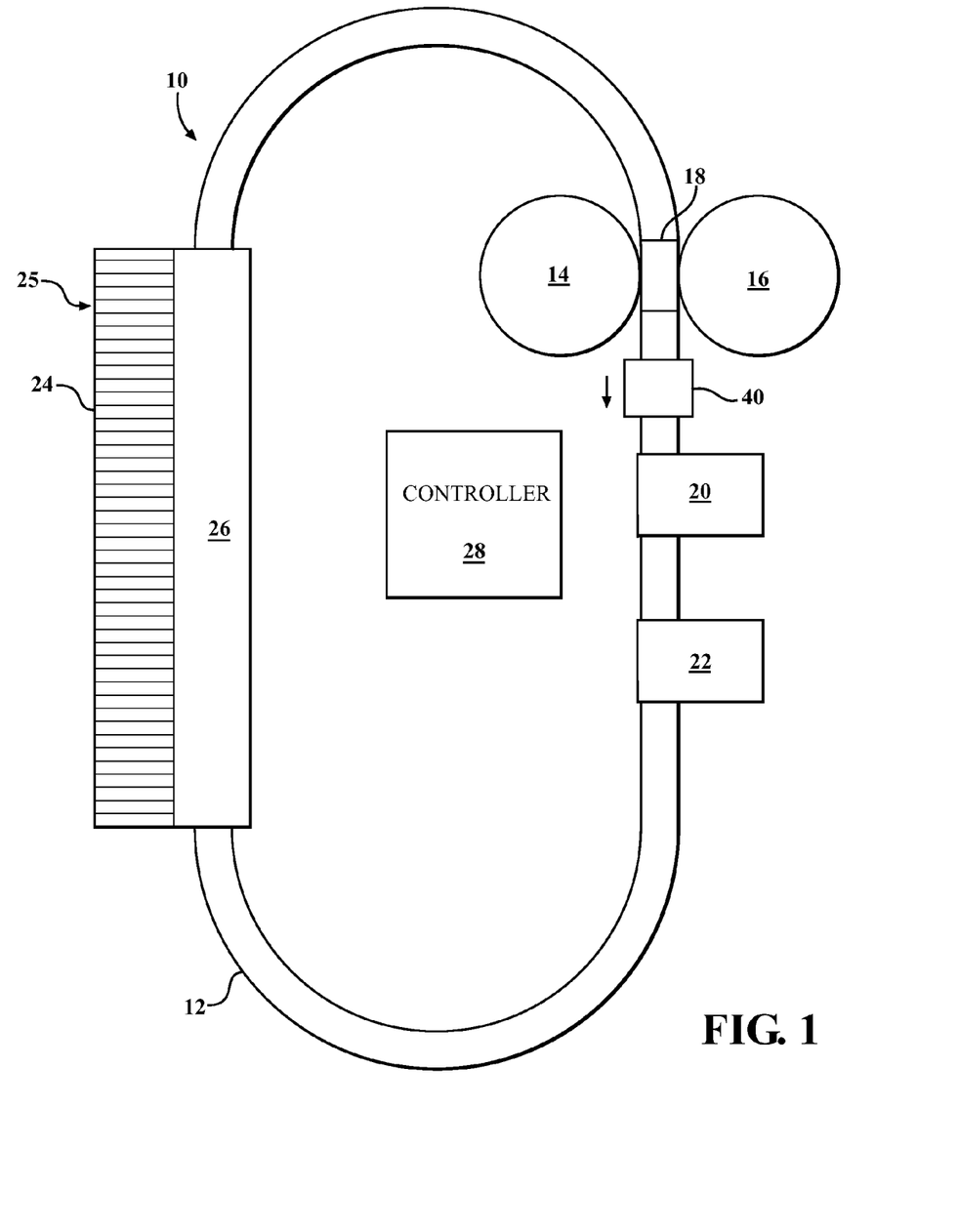
FIG. 1 is a top down view showing one embodiment of an automated test system.

As described starting with respect to FIG. 1, embodiments of an automated test system 10 for testing and sorting of miniature electronic components or devices 11 (FIG. 2) taught herein provide a probe device that can easily align with close contacts while providing spacing for connection to test devices. This is particularly desirable for devices 11 such as light emitting diodes (LEDs) that involve multiple sets of contacts but can also be successfully used for devices 11 requiring only one set of contacts.

Test system 10 includes a conveyor 12 and one or more loading stations, such as a first device loader 14 and a second optional device loader 16 that load electronic devices 11 onto carriers 40 at a transfer station 18. Test system 10 further includes one or more test stations, such as a first test station 20 and a second test station 22 as discussed in more detail hereinafter. Carriers 40 are aligned with respect to first and second test stations 20, 22 for testing. After testing, an unloading station 25 is provided to unload devices 11. A controller 28 is in electrical communication, either wired or wireless, with conveyor 12, first and second device loaders 14, 16, first and second test stations 20, 22, and unloading station 25 to sense and control the operations of each.

Controller 28 has a conventional structure and may include a processor, memory, storage media, communications devices, and input and output devices. For example, controller 28 can be a standard microcontroller that includes a central processing unit (CPU), random access memory (RAM), read only memory (ROM) and input/output ports receiving input signals and sending output signals needed to control the system and to perform certain process steps as described herein. The functions described herein are generally programming instructions stored in memory and are performed by the logic of the CPU. Of course, the controller that performs the functions described herein could be a microprocessor using external memory or could comprise a combination of such a microprocessor or microcontroller combined with other integrated logic circuits. Controller 28 is generally incorporated into or works with a personal computer with a screen and input devices, such as keyboards, for inputting commands for process control and for monitoring the process control.

Figure 2:
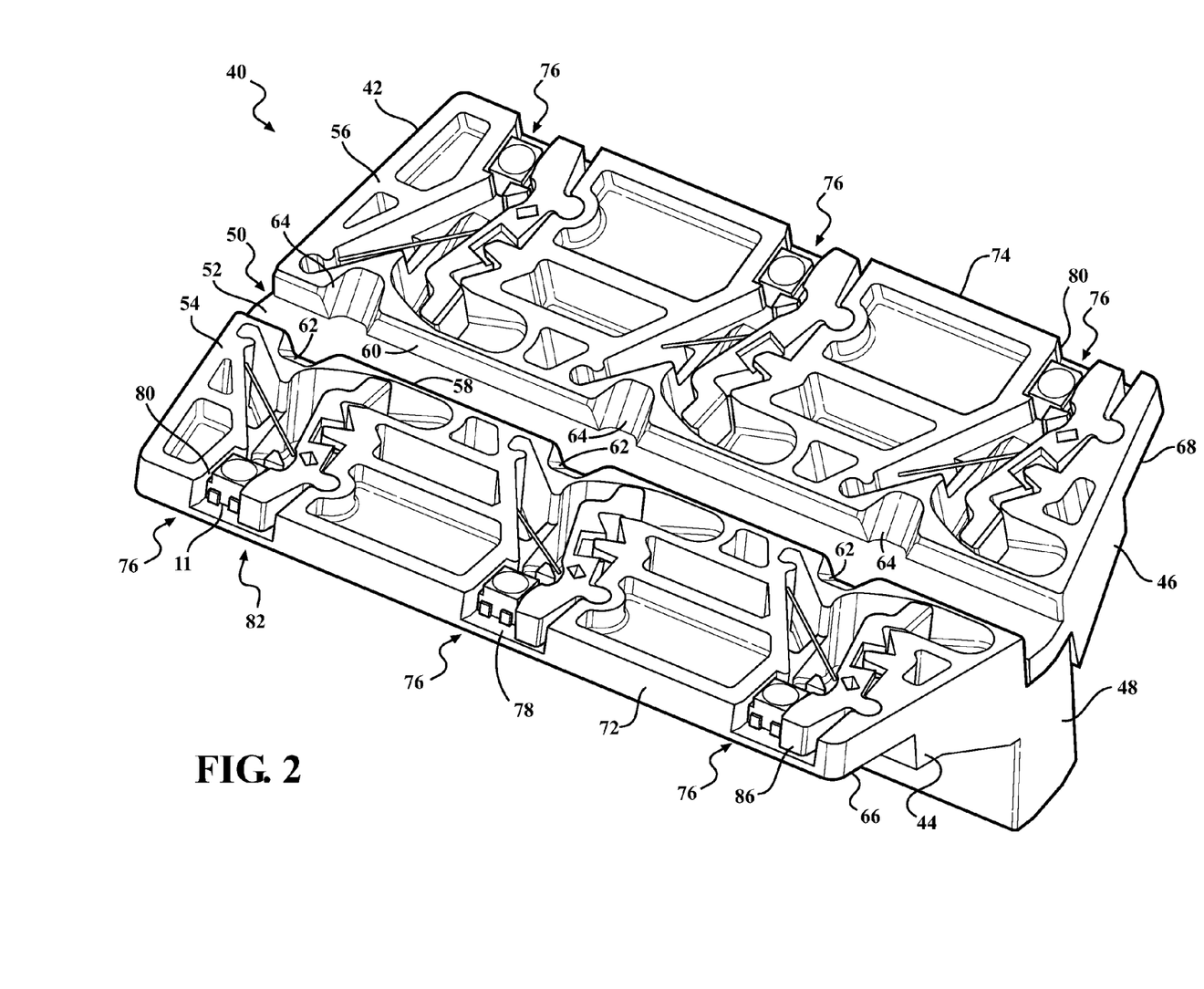
FIG. 2 is a perspective view of one embodiment of a carrier of the automated test system of FIG. 1.
Figure 3:
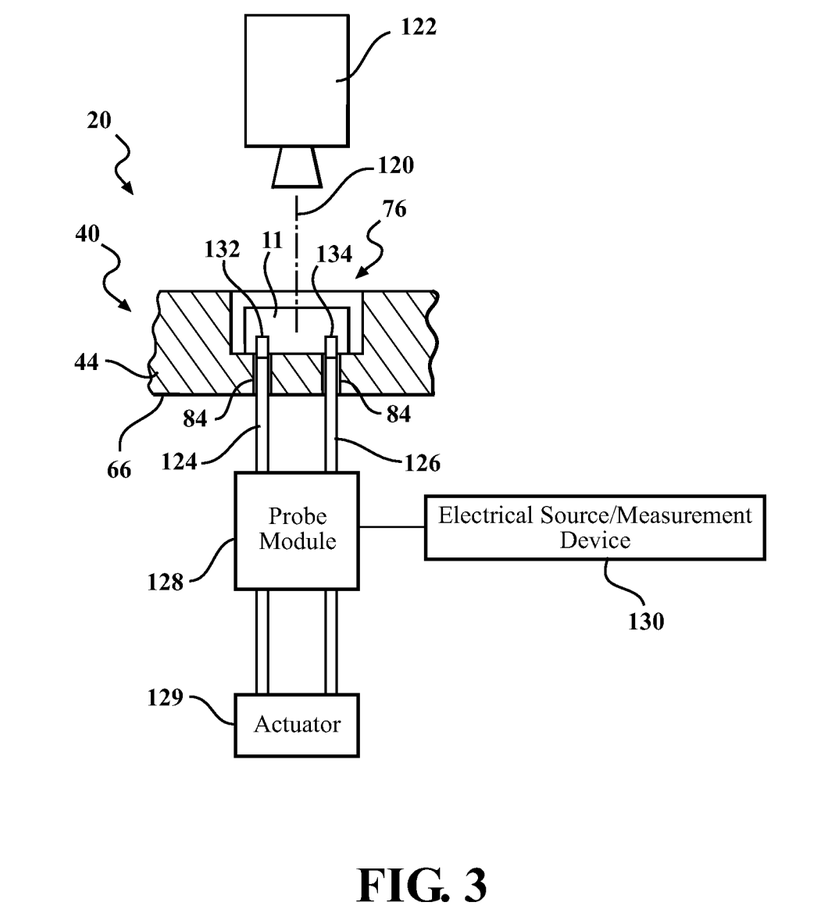
FIG. 3 is a schematic illustration showing alignment of an electronic device with respect to a test station of the automated test system of FIG. 1.

In order to test electronic devices 11 at one or both of first test station 20 and second test station 22, electronic devices 11 are loaded onto carriers 40, one of which is shown by example in FIGS. 2 and 3. Each carrier 40 has a body portion, or body, 42 that may be fabricated as a one piece structure or a multiple piece structure. Body 42 includes a first lateral portion 44 and a second lateral portion 46 that extend outward from a central portion 48 to first and second lateral edges 72, 74 of body 42. First lateral portion 44 and second lateral portion 46 are spaced apart by a central channel 50. Central channel 50 is located above central portion 48 and includes a channel bottom surface 52 that is recessed downward with respect to a top surface 54 of first lateral portion 44 and a top surface 56 of second lateral portion 46. First and second channel sides 58, 60 extend upward from channel bottom surface 52 to respective top surfaces 54, 56.

One or more locating features or structures are formed on body 42. For example, locating features could include pairs of first and second detents 62, 64 formed respectively along first channel side 58 and second channel side 60. First detent 62 and second detent 64 are defined by surfaces that extend outward with respect to first and second channel sides 58, 60, thereby increasing the cross-sectional width of central channel 50 in the area of each pair of first and second detents 62, 64. Locating structures, such as first and second detents 62, 64 are provided to facilitate alignment of carrier 40 with respect to particular portions of test system 10, such as first test station 20 and second test station 22. Various locating structures such as cantilever clips, opposing detents, etc., can be used to facilitate alignment.

In carrier 40, central portion 48 of body 42 extends downward with respect to a bottom surface 66 of first lateral portion 44 and a bottom surface 68 of second lateral portion 46. Central portion 48 could be located directly below central channel 50 and could have a lateral width that is similar to the lateral width of central channel 50.

Carrier 40 is configured to be coupled to conveyor 12 such that carrier 40 moves in response to movement of conveyor 12. For example, an engagement member can be formed on body 42 of carrier 40 for operable engagement of carrier 40 with conveyor 12. Such an engagement member could be formed with any suitable geometry that allows engagement with conveyor 12, such as a downwardly extending tang, flange, projection, rod, post or hook.

At least one device receptacle 76 is defined by body 42. For example, one or more device receptacles 76 could be positioned along first and second lateral edges 72, 74 of body 42. Device receptacles 76 are recessed with respect to top surfaces 54, 56 of first and second lateral portions 44, 46. In the example shown, each device receptacle 76 is defined by a substantially planar base surface 78 and one or more upstanding walls 80 that are respectively defined by first and second lateral portions 44, 46 of body 42. Each base surface 78 extends to one of first lateral edge 72 or second lateral edge 74 of body 42, thereby defining a lateral opening 82 for each device receptacle 76 in body 42. In order to allow testing of electronic devices 11, one or more probe apertures or holes 84 are formed through body 42 in the area of each device receptacle 76. In particular, probe apertures or holes 84 could extend from base surface 78 of each device receptacle 76 to a respective bottom surface 66, 68 of either of first lateral portion 44 or second lateral portion 46, depending on the location of device receptacle 76. In the illustrated embodiment, four probe apertures 84 are provided for each device receptacle 76. However, the number of probe apertures 84 could be modified to suit a particular application.

In order to retain the electronic devices 11, carrier 40 may include a plurality of clamping structures 86 in correspondence to device receptacles 76. For example, a single clamping structure 86 is provided at each device receptacle 76 in FIG. 2. At least a portion of each clamping structure 86 biases into engagement with a respective one of electronic devices 11 in a manner that is suitable to clamp electronic device 11 with respect to body 42. For example, this could be done by capturing electronic device 11 in engagement between clamping structure 86 and one of upstanding walls 80 that defines device receptacle 76. Other configurations could, however, be utilized.

Conveyor 12 is configured to support and move carriers 40 in a continuous circuit and may be formed in any suitable geometry. Conveyor 12 could include, for example, a first rail and a second rail that are spaced apart with respect to one another with respective top surfaces that are configured to engage and support carrier 40. Conveyor 12 could be provided with additional structures that engage and support the carriers 40, such as rollers.

A belt is typically provided as the primary moving component of conveyor 12 such that objects that are moved by conveyor 12 are moved in correspondence to movement of the belt. Conveyor 12 is an indexing conveyor that indexes the position of the belt under the influence of a motor (not shown) or other suitable means. Carriers 40 are fixedly attached to respective positions along the belt, such as by affixing their engagement elements with a cleat affixed for movement with the belt. Movement of belt brings carriers 40 and hence their supported electronic devices 11 into alignment with first and second test stations 20, 22, as will be described in detail hereinafter. Although the description is made with reference to a belt as the primary moving component of conveyor 12, it should be understood that other suitable structures could be provided, such as a chain or cable.

As shown in FIG. 3, carrier 40 is indexed along conveyor 12 so that electronic device 11 is arranged relative to an alignment axis 120 at first test station 20. By way of example, the test performed at first test station 20 utilizes an optical instrument 122 and an electrical source/measurement device 130. In this test station 20, source/measurement device 130 applies a test voltage signal to test contacts 124, 126 to cause electronic device 11 to emit light, while optical instrument 122 measures light output parameters such as luminous flux and spectral light output. Optical instrument 122 could be, for example, a spectrophotometer and an integrating sphere. In another test station 22, or where electronic device 11 is not an LED (such that light output does not need to be measured), optical instrument 122 is omitted. Source/measurement device 130 applies an electrical signal (such as a test voltage or test current) to electronic device 11 and reads an output signal of electronic device 11, generally a voltage across or a current output from electronic device 11. An exemplary source/measurement device 130 that can perform these functions is the Model 616 Test and Measurement Source, manufactured by Electro Scientific Industries, Inc. of Portland Oreg. Alternatively, separate source and measurement devices can be used in place of integrated source/measurement device 130. Source and measurement devices can also be located at different test stations 20, 22, such that the source device applies its test signal at test station 20, for example, while the measurement device reads an output signal at test station 22.

Electrical connections between source/measurement device 130 and device 11 occur through contact between terminals 132, 134 of device 128 and a probe contact or module 128. Probe module 128 includes four pairs of test contacts 124, 126 (only two shown in FIG. 3) that are moved into and out of probe apertures 84 of carrier 40 under the influence of a probe actuator 129. More specifically, probe module 128 is actuated by probe actuator 129 is a generally linear manner so as to move test contacts 124, 126 into an out of probe apertures 84. Probe actuator 129 is preferably high-speed means for movement of probe module 128, such a voice coil motor or piezoelectric actuator.

Figure 4:
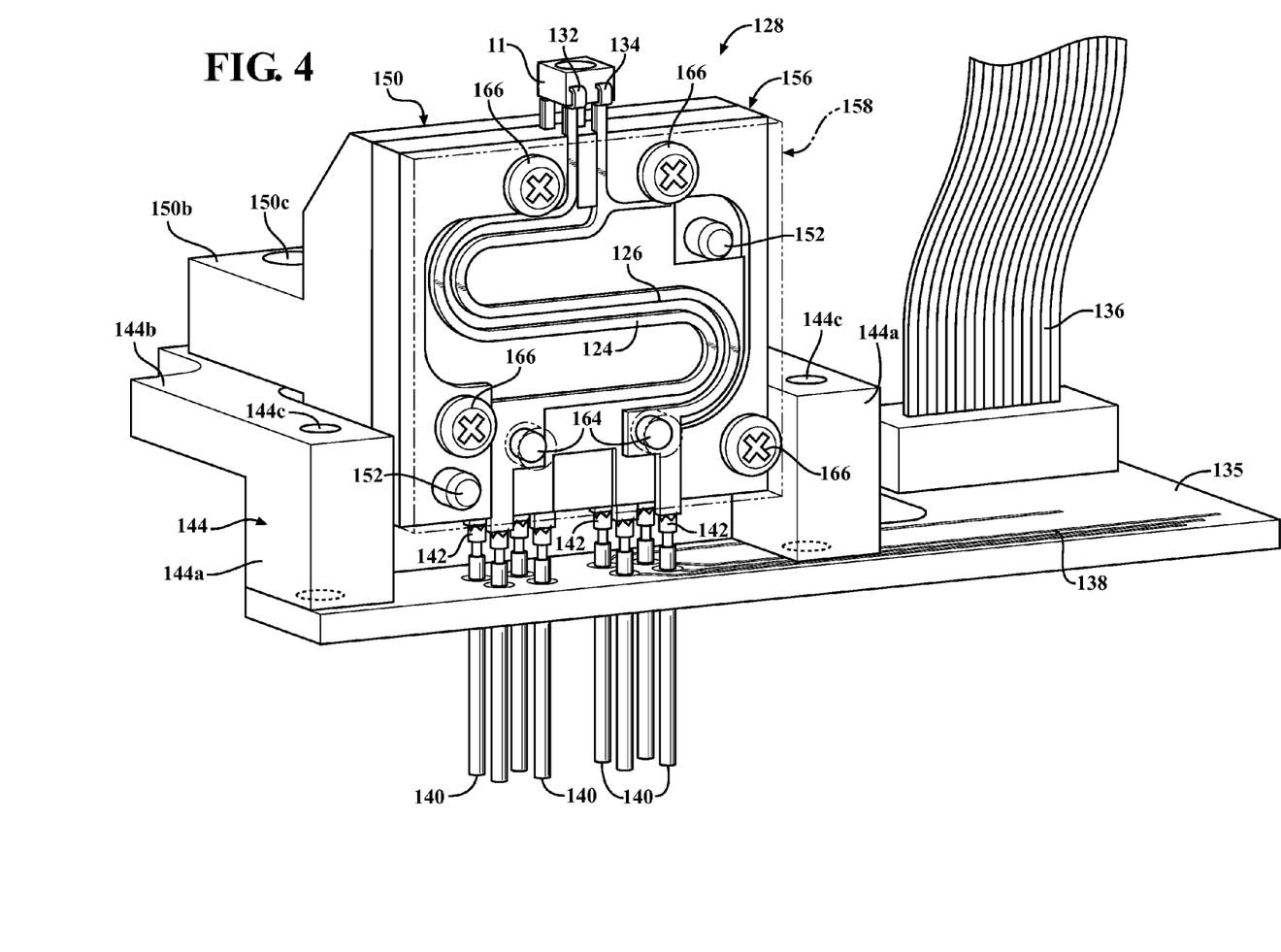
FIG. 4 is a perspective view of one embodiment of a probe module mounted in the test station of FIG. 3.

FIG. 4 shows the electrical connections between electronic device 11, one embodiment of a probe module 128 and source/measurement device 130 in additional detail. In FIG. 4, carrier 40 is omitted for clarity. Probe module 128 is fixedly mounted to a circuit board 135 having electrical traces 138. Electrical traces 138 are electrically coupled to conductors of a ribbon cable 136 by conventional techniques, while ribbon cable 136 is in turn electrically coupled to source/measurement device 130. A plurality of spring loaded pins 140 are coupled to a respective electrically-isolated trace of electrical traces 138. The number of spring loaded pins 140 corresponds to the number of test contacts 124, 126 of probe module 128. Here, four pairs of test contacts 124, 126 are included by example, so eight spring loaded pins 140 are shown.

As mentioned, probe module 128 is fixedly mounted to circuit board 135. In the arrangement shown, probe module 128 is coupled to a platform 144 with vertically extending legs 144a on either side surface of probe module 128. Vertically extending legs 144a extend from a generally U-shaped portion 144b of platform 144 and are fixed to circuit board 135 by bolts (not shown) extending through holes 144c. Other means of securing platform 144 to circuit board 135 can be used such as welding, gluing, etc. Probe module 128 is fixed to U-shaped portion 144b of platform 144 as discussed hereinafter. Vertically extending legs 144a extend U-shaped portion 144b to a height such that a bottom surface of probe module 128 is spaced apart from circuit board 135.

Spring loaded pins 140 are fixedly mounted through circuit board 135, and extend above circuit board 135 such that their contact pin tips 142 contact a respective test contact 124 or 126 extending through the bottom surface of probe module 128.

Platform 144 does not need to be U-shaped. Instead, platform 144 could comprise two separate mounting legs, each of which would have a separate connection to probe module 128. Alternatively, circuit board 135 could be extended so that platform 144 could have a relatively uniform vertical thickness about its entire U-shape supported by circuit board 135. However, the arrangement shown minimizes the weight needed to be moved over a programmed range by actuator 129 while maintaining stability.

Figure 5:
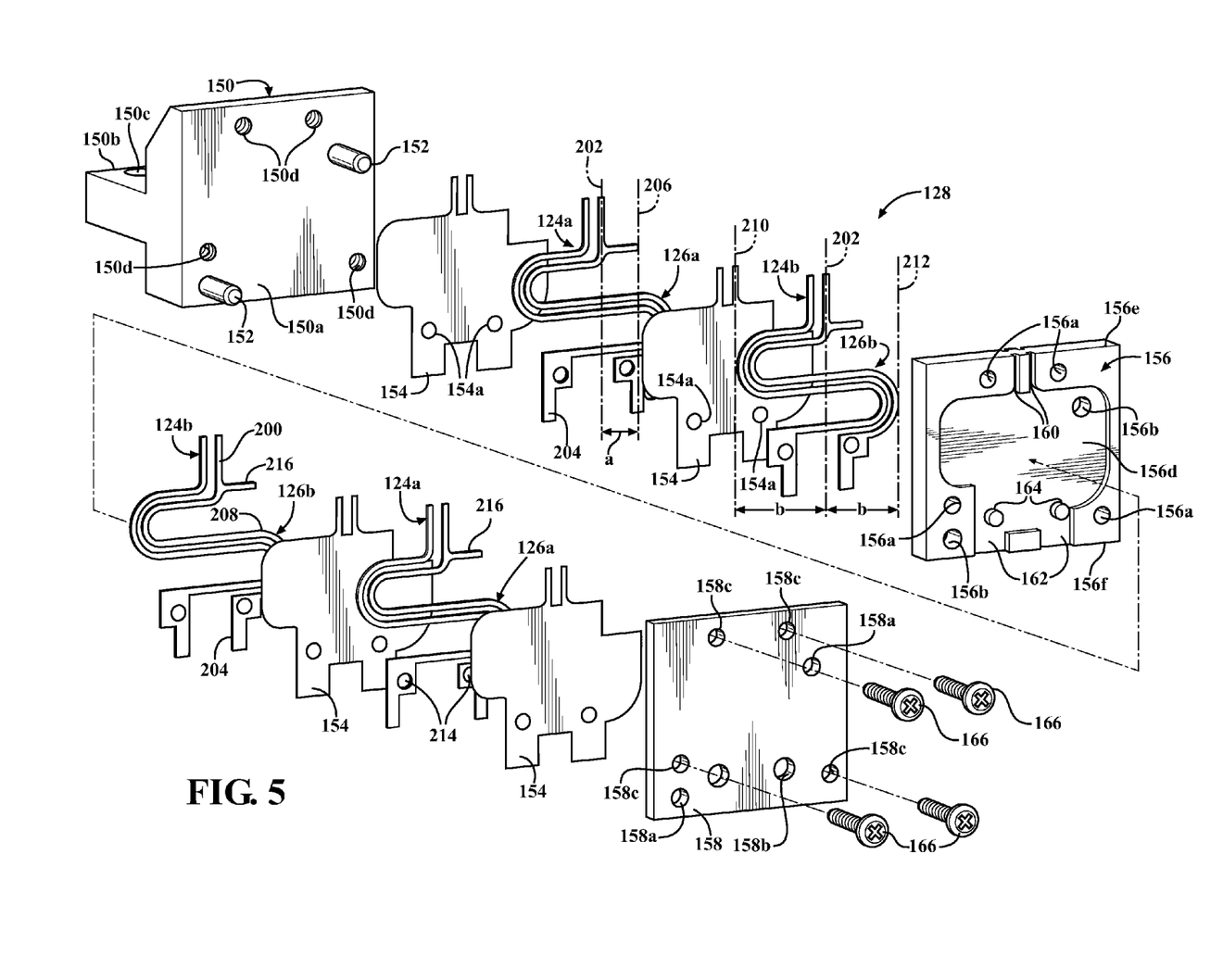
FIG. 5 is an exploded view of the probe module according to FIG. 4.

As shown in further detail in FIG. 5, probe module 128 includes four sets or pairs of test contacts 124, 126, each pair here called first pair 124a, 126a or second pair 124b, 126b but called contacts 124, 126 unless necessary to distinguish between pairs 124a, 126a or 124b, 126b. Although four pairs are shown herein, as few as one pair of contacts 124, 126 can be used in probe module 128. Test contacts 124, 126 are formed such that they are electrically insulated from each other, reach closely-spaced terminals 132, 134 of electronic device 11 at one end, and are sufficiently spaced at the opposing end so that spring loaded pins 140 can form contacts without interfering with each other.

More specifically, each pair of contacts 124, 126 is arranged in an interleaved serpentine pattern. That is, each contact 124 and 126 includes a first end or contact tip 200 that extends linearly centered along a line 202. In the embodiment of FIG. 5, line 202 is a vertical line because contact tip 200 extends vertically. A second end opposite to contact tip 200 is called a contact base 204 herein. Contact base 204 extends linearly centered along a line 206. Like line 202, line 206 is a vertical line because contact base 204 extends vertically. Contact tip 200 and contact base 204 extend in opposite directions from a third curved portion or contact beam or body 208 and are spaced apart in the horizontal direction by a spacing a such that lines 202, 206 are parallel to each other. As shown in FIG. 5, when more than one pair of contacts 124, 126 is incorporated into a single probe module 128, first pair 124a, 126a and second pair 124b, 126b can be formed such that spacing a between lines 202, 206 for first pair 124a, 126a is different from spacing a for second pair 124b, 126b. In this case, spacing a is the same for each contact of a pair 124a, 126a or 124b, 126b, but this is not necessary.

Here, contact beam 208 curves in a serpentine geometry along a plane defined by lines 202, 206. That is, contact body 208 extends generally perpendicular from contact tip 200 and curves into a generally S shape before reaching contact base 204. While serpentine geometry is shown, it is not necessary. The use of serpentine geometry provides many advantages. For example, it allows a long flexing portion for contact 124, 126, which affords a relatively long vertical travel path for contact 124, 126. In addition, contact tip 200 can be placed at the horizontal center of the serpentine pattern as in the illustrated embodiment. That is, the outer edges of the serpentine pattern extend for a same distance from contact tip 200. As shown in FIG. 5, where a line 210, 212 is drawn in parallel to line 202 at the outer edge of opposing sides of the serpentine pattern of contact beam 208, a spacing b between line 202 and line 210 is equal to a spacing b between line 202 and line 212. According to this arrangement, as contacts 124, 126 are respectively depressed against terminals 132, 134, contact tip 200 maintains a generally vertical orientation and a generally constant horizontal position.

Contacts 124, 126, including their tips 200, bases 204 and beams 208 as described above, are interleaved. Contact tip 200 of each is placed close together, which is necessary for many small electronic components. As shown, contact beams 208 are a constant 0.015" wide and 0.010" thick and are spaced the same distance apart from each other in each pair 124a, 126a and 124b, 126b as contact tips 200. Contactor beams 208 in this example produce a small "scrub" motion, which is a horizontal displacement of the contact tip position as contact 124 or 126 is compressed. Scrub is used to provide a cleaning action of contact tips 200 and terminals 132, 134 that creates an improved ohmic contact condition by removing or moving surface contaminants such as oxidation. In some applications no scrub is needed so contact beam geometry can be easily altered to reduce or increase scrub as needed. Instead of a constant beam width, for example, beam 208 can be tapered, becoming gradually smaller in width the farther away from contact tip 200. This will cause a more uniform flexing of beam 208, which is turn will cause a more uniform vertical travel. The serpentine section can also be increased as well, which will have the same effect. That is, although contact beam 208 curves to form only one S shape, one or more additional curves can be added thereto.

Contact beam 208 can be wider or thinner than contact tip 200. This allows the contact force to be easily manipulated as needed. For example, depending on component material and/or contact tip material, contact force between 5 grams and 80 grams is achievable. Contacts 124, 126 are a simple flat shape as shown so they can fabricated economically by photochemical etching, stamping or laser machining. Common materials such as copper beryllium, phosphor bronze and tungsten are readily available in flat material and suitable thicknesses of, for example, 0.004" to 0.020". Other contact materials such as tungsten copper or beryllium nickel are also available in a thin flat stock configuration.

Contacts 124, 126 are supported within probe module 128 with through-holes 214 integral between contact base 204 and contact beam 208. More specifically, and still referring to FIG. 5, probe module 128 includes a mounting support 150. Mounting support 150 forms generally an extended T shape. A top of mounting support 150 forms a mounting surface 150a, here generally square-shaped. Extending opposite from mounting surface 150a is a horizontally-extending flange 150b including a vertically-extending through-hole 150c. Horizontally-extending flange 150b is fixedly secured to U-shaped portion 144b of platform 144 by, for example, a bolt (not shown) extending through through-hole 150c and into the surface of U-shaped portion 144b. Mounting support 150 is preferably made of a lightweight plastic material, but any non-conductive material is appropriate.

Mounting surface 150a has a number of threaded holes 150d, here four by example, extending into mounting surface 150a for securing the remaining components of probe module 128 to mounting support 150 as described in additional detail hereinafter. Extending outwardly from mounting surface 150a are two metal pins 152 used to align the layers of probe module 128. Pins 152 do not have to be metal, but making them of metal provides some additional structural support for mounting support 150. Layers mounted on pints 152 include, in order, contact pair insulator 154, first contact pair 124a, 126a, contact pair insulator 154, second contact pair 124b, 126b, center insulator 156, second contact pair 124b, 126b, contact pair insulator 154, first contact pair 124a, 126a, contact pair insulator 154 and cover 158.

Center insulator 156 comprises an insulating material such as a plastic or ceramic material and has outer edges preferably coincident with the outer edges of mounting surface 150a. Center insulator 156 includes four through-holes 156a aligned with threaded holes 150d of mounting surface 150a and two through-holes 156b aligned with metal pins 152. Each surface of center insulator 156 facing contact pair 124, 126 (called a facing surface) includes a depression 156d. Depression 156d has a sufficient depth to mount contact pairs 124a, 126a and 124b, 126b and contact pair insulators 154 without extending beyond the facing surface of center insulator 156. While only one surface depression 156d is shown, the opposing surface of center insulator 156 includes the same shaped depression 156d.

Depression 156d has an outer contour shaped to surround contact beams 208. Extending from depression 156b and through a top edge 156e of center insulator 156 is a pair of trenches 160. Trenches 160 are spaced apart in top edge 156e by the same distance separating contact tips 200. Extending from depression 156b and through a bottom edge 156f of center insulator 156 is a pair of openings 162. Openings 162 are spaced apart in bottom edge 156f and are of sufficient size so that contact bases 204 from each of contacts 124a, 124b can extend through one opening 162 and contact bases 204 from each of contacts 126a, 126b can extend through the other opening 162. The spacing between the bottoms of depressions 156d and the bottoms of trenches 160 depends upon the spacing between adjacent sets of terminals 132, 134.

Two horizontally-spaced insulative locator pins 164 extend from a surface of depression 156d. Locator pins 164 are preferably ceramic and are used in putting together probe module 128. Specifically, in order to form probe module 128, each contact of second contact pair 124b, 126 is first mounted to center insulator 156 by engagement of its through-hole 214 with one of locator pins 164. Although not shown, each contact pair 124, 126 is preferably stamped in one piece with a handling tab, which is a small horizontal connecting beam that spans the between contact bases 204 of contact pair 124, 126. The tab can be used to simplify the processing, handling and installation of the contact pairs 124, 126 by installing the two contacts at the same time.

After second contact pair 124b, 126b is mounted to central insulator 156 by engagement of through-holes 214 with locator pins 164, locator through-holes 154a of contact pair insulator 154 are engaged with locator pins 164 so as to affix contact pair insulator 154 to central insulator. Next, first contact pair 124a, 126a is mounted to central insulator 156 by engagement of through-holes 214 with locator pins 164 preferably with the aid of the handling tab discussed previously. Another contact pair insulator 154 is optionally placed on top of first contact pair 124a, 126a. Then, through-holes 156b of central insulator 156, which are aligned with metal pins 152, are fitted onto metal pins 152 and pressed so that central insulator 156 contacts facing surface 150a of mounting support 150. Depression 156d and facing surface 150a thus form a contact housing. Although not shown, depressions are generally formed in facing surface 150a aligned with locator pins 164 since locator pins 164 preferably extend beyond the surface of central insulator 156 for easier mounting thereon.

Once central insulator 156 is mounted on mounting support 150, another second contact pair 124b, 126, contact pair insulator 154, first contact pair 124a, 126a and contact pair insulator 154 are mounted in depression 156d in the same manner as already described. Thereafter, through-holes 158a in cover 158 are fitted over metal pins 152. Preferably, the outer edges of cover 158 conform to the outer edges of central insulator 156 and facing surface 150a of mounting support 150. Through-holes 158b in the inner surface of cover 158 are aligned with locator pins 164 because locator pins 164 preferably extend beyond the surface of central insulator 156 as mentioned previously. Although through-holes 158b are shown, bores extending only part way into the inner surface of cover 158 could be used instead.

Through-holes 158c extend through cover 158 and are aligned with threaded holes 150d. Four bolts 166 extend through through-holes 158c and engage with threaded holes 150d to secure cover 158 to mounting support 150. Depression 156d and facing surface of cover 158 thus form a contact housing. Once cover 158 is secured, any handling tabs associated with contact pairs 124, 126 can be broken off to electrically separate contact 124 from 126. In this way, there are only four contact parts to be handled instead of eight. Cover 158 is preferably a non-conductive material, such as a resin or plastic material.

As shown in FIG. 5, each contact pair insulator 154 is a sheet comprising a thin insulator material such as Kapton or PEEK. For example, first contact pair 124a, 126a can be spaced apart by second contact pair 124b, 126b by a single contact pair insulator 154 with a thickness of 0.005". This contact spacing can be changed simply by changing the insulator size or by stacking up various thicknesses of insulator.

Thus far, mention has not been made of extension 216 of each contactor 126. As can be seen from FIGS. 4 and 5, contact tip 200 of contactor 124 turns into a right angle to form contact beam 208. This right angle contacts the interior surface of depression 156d, thus limiting upward travel of contactor 124. Contact beam 208 of contactor 126 is, however, inside of contact beam 208 of contactor 124 with respect to the interior surface of depression 156d. Therefore, extension 216 is provided for each contactor 126 to limit upward travel of contactor 126. Extension 216 has an upper horizontal surface that extends from the junction of contact tip 200 and contact beam 208 generally in parallel with an upper surface of contact beam 208 of contactor 124. Upper surface of extension 216 thus contacts the generally flat interior surface of depression 156d to limit upward travel. Extension 216 also aids in providing resilient force for mounting contact pairs 124, 126 within depression 156d.

In operation, electronic devices 11 are loaded into the device loaders 14, 16, where they are singulated. Following singulation, the devices are transferred from device loaders 14, 16 to conveyor 12 at a transfer station 18. Transfer station 18 is configured to move electronic devices 11 individually from device loaders 14, 16 to carriers 40 using mechanical or pneumatic means.

Conveyor 12 indexes, or moves a predetermined amount, which moves electronic devices 11 sequentially into proximity with first test station 20 and second test station 22. First and second test stations 20, 22 may be configured to measure electronic devices 11 for parameters such as charging time, leakage current, forward operating voltage, electrical current draw, resistance value, etc., depending upon the type of electronic device 11. In addition, if electronic devices 11 are LEDs, they may also be measured for light output parameters such as luminous flux and spectral light output. Using probe module 128, each terminal 132, 134 of device 11 is in electrical engagement with two contacts 124 or 126 for flexibility with input/output signals, but this is not necessary.

Following testing, electronic devices 11 are unloaded at an unloading station 25. Unloading station 25 can be configured to sort electronic devices 11 based on the results of the tests using a bin assembly 24 and an ejection assembly 26. Bin assembly 24 includes a number of bins, and ejection assembly 24 ejects each electronic device 11 individually into a selected one of the bins of bin assembly 24 using, for example, selective application of pressurized air.

The inventive contacts described herein allow each contact tip 200 to travel in a generally vertical direction where contact tip 200 is centered about the flexing members of contact beam 208 while simultaneously allowing closely-spaced contact points. This is advantageous over cantilevered contacts, which would typically require a large and complex offset 4-bar flexure in each contact in order to produce a generally vertical motion. That arrangement would be comparatively large, which is undesirable for high-speed actuation.

Further, when contacts 124, 126 are made from flat material and require no post-forming, the contact cost is reduced and life is also increased when compared to pogo pins, which typically have at least three separate components per tip. Flat material usage also allows the use of varied contact materials to be easily implemented. Contacts 124, 126 are interleaved within a plane defined by the flat material when the flat material is used.

Additionally, contact scrub can be easily changed with simple changes to the beam geometry. Contact module 128 shown is compact and lightweight, which affords high speed motion.

Finally, contact force can also be easily altered by simple changes to the beam geometry.

While the invention has been described in connection with certain embodiments, it is to be understood that the invention is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A probe module for testing an electronic device, comprising:
at least two contacts, each contact including a first end portion extending in a first direction along a first line, a second end portion extending linearly in a second direction opposite from the first direction and along a second line, and a third curved portion extending between the first end portion and the second end portion; and
a housing enclosing the at least two contacts and including a depression into which the at least two contacts are fitted such that the first end portion of each contact extends through a first end of the housing and the second end portion of each contact extends through a second end of the housing opposite to the first end of the housing, the depression sized so that the at least two contacts are movable therewithin; wherein
the at least two contacts includes a first contact and a second contact, the first end portion of the first contact and the first end portion of the second contact separated by a first portion of the housing, and the second end portion of the first contact and the second end portion of the second contact separated by a second portion of the housing;
the first line is spaced apart from and in parallel with the second line; and
the at least two contacts are spaced apart from each other in a direction perpendicular to the first line and the second line.

2. The probe module of claim 1 wherein each third curved portion has a serpentine shape.

3. The probe module of claim 2 wherein each first end portion is centered between outer edges of the serpentine shape.

4. The probe module of claim 1 wherein each of the at least two contacts comprises a flat material and wherein the at least two contacts are interleaved within a plane defined by the flat material.

5. The probe module of claim 1 wherein the at least two contacts includes the first contact and the second contact interleaved in a first layer and a third contact and a fourth contact interleaved in a second layer, the probe module further comprising:
an insulating sheet between the first layer and the second layer, the insulating sheet shaped so as to prevent contact between the contacts of the first layer and the contacts of the second layer.

6. The probe module of claim 5 wherein spacing between the first end portions of the first contact and the second contact is a same as spacing between the first end portions of the third contact and the fourth contact; and wherein spacing between the second end portions of the first contact and the second contact is different from spacing between the second end portions of the third contact and the fourth contact.

7. A probe module for testing an electronic device, comprising:
  at least two contacts, each contact including a first end portion extending in a first direction along a first line, a second end portion extending linearly in a second direction opposite from the first direction and along a second line, and a third curved portion extending between the first end portion and the second end portion; wherein
  the first line is spaced apart from and in parallel with the second line;
  the at least two contacts are spaced apart from each other in a direction perpendicular to the first line and the second line; and
  the at least two contacts include a first contact and a second contact, the probe module further comprising:
  a contact housing including a depression surrounding the third curved portions of the first contact and the second contact;
  adjacent trenches extending from the depression to external of the contact housing, the first end portion of the first contact located in a first trench of the adjacent trenches and the first end portion of the second contact located in a second trench of the adjacent trenches; and
  spaced-apart openings extending from the depression to external of the contact housing in a direction opposite to the adjacent trenches, the second end portion of the first contact located in a first opening of the spaced-apart openings and a second end portion of the second contact located in a second opening of the spaced-apart openings.

8. The probe module of claim 7 wherein the depression includes a limiting surface extending generally perpendicular from the adjacent trenches, the first end portion and the third curved portion of the first contact form a first right angle in contact with the first trench and the limiting surface, the first end portion and the third curved portion of the second contact form a second right angle in a same direction as the first right angle, and the second contact comprises:
  an extension portion extending from the first end portion of the second contact adjacent the second right angle and in a direction opposite to the second right angle, an upper surface of the extension portion in contact with the limiting surface.

9. The probe module of claim 7 wherein the probe housing further comprises at least one of:
  a mounting surface and an insulator mounted to the mounting surface, the insulator including the depression; or
  the insulator and a cover mounted to the insulator, the insulator including the depression.

10. The probe module of claim 7, further comprising:
  a module mount including a mounting surface and a mounting flange extending perpendicularly relative to the mounting surface on a surface opposite from the mounting surface;
  a central insulator coupled to the mounting surface, the depression located in the central insulator facing the mounting surface; wherein the central insulator comprises a second depression in a surface opposite the mounting surface and the at least two contacts include a third contact and a fourth contact, the third curved portions of the third contact and the fourth contact surrounded by the depression;
  second adjacent trenches extending from the second depression to external of the central insulator in a same direction as the adjacent trenches, the first end portion of the third contact located in a first trench of the second adjacent trenches and the first end portion of the fourth contact located in a second trench of the second adjacent trenches;
  second spaced-apart openings extending from the second depression to external of the second depression in a same direction as the spaced-apart openings, the second end portion of the third contact located in a first opening of the second spaced-apart openings and a second end portion of the fourth contact located in a second opening of the second spaced-apart openings; and
  a cover facing the second depression and secured to the mounting surface.

11. The probe module of claim 10 wherein the first contact and the second contact comprise a first interleaved contact layer, the third contact and the fourth contact comprise a second interleaved contact layer, and the at least two contacts includes a fifth contact and a sixth contact interleaved in a third interleaved contact layer arranged in the depression and a seventh contact and an eight contact interleaved in a fourth interleaved contact layer arranged in the second depression, the probe module further comprising:
  a first insulating sheet between the first interleaved contact layer and the third interleaved contact layer, the first insulating sheet shaped so as to prevent contact between the contacts of the first interleaved contact layer and the contacts of the third interleaved contact layer; and
  a second insulating sheet between the second interleaved contact layer and the fourth interleaved contact layer, the second insulating sheet shaped so as to prevent contact between the contacts of the second interleaved contact layer and the contacts of the fourth interleaved contact layer.

12. The probe module of claim 11 wherein
  a same spacing exists between the first end portions of the first contact and the second contact, between the first end portions of the third contact and the fourth contact, between the first end portions of the fifth contact and the sixth contact and between the first end portions of the seventh contact and the eight contact; wherein
  a same first spacing exists between the second end portions of the first contact and the second contact and between one of the second end portions of the fifth contact and the sixth contact or the second end portions of the seventh contact and the eighth contact; wherein
  a same second spacing exists between the second end portions of the third contact and the fourth contact and between the other of the second end portions of the fifth contact and the sixth contact or the second end portions of the seventh contact and the eight contact; and wherein
  the first spacing is different from the second spacing.

13. A method of manufacturing a probe module for testing an electronic device, comprising:
  arranging at least two contacts in a spaced relationship with each other within a depression of a housing, each contact including a first end portion extending in a first direction along a first line, a second end portion extending linearly in a second direction opposite from the first direction and along a second line, and a third curved portion extending between the first end portion and the second end portion, such that the at least two contacts are spaced apart from each other in a direction perpendicular to the first line and the second line, the first end portion of each contact extends through a first end of the housing and the second end portion of each contact extends through a second end of the housing opposite to the first end of the housing, the depression sized so that the at least two contacts are movable therewithin; and enclosing the at least two contacts within the housing; wherein the at least two contacts includes a first contact and a second contact, the first end portion of the first contact and the first end portion of the second contact separated by a first portion of the housing, and the second end portion of the first contact and the second end portion of the second contact separated by a second portion of the housing; and the first line is spaced apart from and in parallel with the second line.

14. The method of claim 13 wherein the at least two contacts includes the first contact and the second contact interleaved with each other and each third curved portion has a serpentine shape; and wherein arranging the at least two contacts comprises:

coupling each of the first contact and the second contact adjacent an insulating surface of an insulator of the housing to form a first contact layer; and after forming the first contact layer, coupling the insulator to a mounting surface of the housing such that the third curved portions of the first contact and the second contact are enveloped by the insulating surface and the mounting surface, the first end portions of the first contact and the second contact extend external of the mounting surface and the insulator, and the second end portions of the first contact and the second contact extend external of the mounting surface and the insulator.

15. The method of claim 14 wherein the at least two contacts includes a third contact and a fourth contact interleaved with each other, and wherein arranging the at least two contacts comprises:

coupling each of the third contact and the fourth contact to a second insulating surface of the insulator to form a second contact layer; and after forming the second contact layer and coupling the insulator to the mounting surface, affixing a cover of the housing to the mounting surface through the insulator such that the third curved portions of the third contact and the fourth contact are enveloped by the second insulating surface and the cover, the first end portions of the third contact and the fourth contact extend external of the cover and the insulator, and the second end portions of the third contact and the fourth contact extend external of the cover and the insulator.

16. The method of claim 14 wherein the at least two contacts includes a third contact and a fourth contact interleaved with each other, and wherein arranging the at least two contacts comprises:

arranging an insulating sheet adjacent the first contact layer before coupling the insulator to the mounting surface;

coupling each of the third contact and the fourth contact adjacent the insulating sheet to form a second contact layer before coupling the insulator to the mounting surface, wherein the insulating sheet is shaped so as to prevent contact between the contacts of the first contact layer and the contacts of the second contact; and wherein the insulator is coupled to the mounting surface of the housing such that the third curved portions of the third contact and the fourth contact are enveloped by the insulating surface and the cover, the first end portions of the third contact and the fourth contact extend external of the module mount and the insulator in a same direction as the first end portions of the first contact and the second contact, and the second end portions of the third contact and the fourth contact extend external of the module mount and the insulator in a same direction as the second end portions of the first contact and the second contact.

17. The method of claim 16 wherein a spacing between the first end portions of the first contact and the second contact is equal to a spacing between the first end portions of the third contact and the fourth contact; and wherein a spacing between the second end portions of the first contact and the second contact is different from a spacing between the second end portions of the third contact and the fourth contact.

18. The method of claim 13 wherein the depression surrounds the third curved portions of the first contact and the second contact and the depression includes:

adjacent trenches extending to the first end of the housing, the first end portion of the first contact located in a first trench of the adjacent trenches and the first end portion of the second contact located in a second trench of the adjacent trenches; and spaced-apart openings extending to the second end of the housing, the second end portion of the first contact located in a first opening of the spaced-apart openings and a second end portion of the second contact located in a second opening of the spaced-apart openings.

* * * * *